United States Patent [19]
Nakashiba

[11] Patent Number: 5,809,102
[45] Date of Patent: Sep. 15, 1998

[54] CCD HAVING CHARGE-INJECTED POTENTIAL BARRIER REGIONS PROTECTED FROM OVERVOLTAGES

[75] Inventor: Yasutaka Nakashiba, Tokyo, Japan

[73] Assignee: NEC Corporation, Japan

[21] Appl. No.: 935,642

[22] Filed: Sep. 23, 1997

[30] Foreign Application Priority Data

Sep. 25, 1996 [JP] Japan .................................. 8-252733

[51] Int. Cl.⁶ .......................... G11C 19/28; H01L 29/768; H01L 23/60
[52] U.S. Cl. ............................. 377/61; 257/248; 257/356
[58] Field of Search .................................... 257/246, 248, 257/356; 377/61

[56] References Cited

U.S. PATENT DOCUMENTS

| | | | |
|---|---|---|---|
| 3,555,374 | 1/1971 | Usuda ...................................... | 257/356 |
| 3,796,932 | 3/1974 | Amelio et al. ........................... | 257/218 |
| 3,947,863 | 3/1976 | Powell .................................... | 257/248 |
| 4,356,502 | 10/1982 | Yamada .................................... | 257/356 |
| 4,761,565 | 8/1988 | Kannegundla ............................ | 377/61 |

FOREIGN PATENT DOCUMENTS

| | | | |
|---|---|---|---|
| 1022496 | 1/1998 | Japan ........................... | H01L 21/339 |

Primary Examiner—Gene M. Munson
Attorney, Agent, or Firm—Hayes, Soloway, Hennessey, Grossman & Hage, P.C.

[57] ABSTRACT

A charge-coupled device comprises a substrate, a charge transfer layer on the substrate, an insulating layer on the charge transfer layer, and a sequence of electrodes divided into recurrent groups of first, second, third and fourth electrodes each, the electrodes being arranged in a single-layered structure on the insulating layer. First, second, third and fourth conductors are connected respectively to the first, second, third and fourth electrodes of each electrode group. The insulating layer permanently holds electrons in positions respectively corresponding to the second and fourth electrodes of each group. First, second, third and fourth breakdown diodes are connected respectively to the first, second, third and fourth conductors, where the first and third breakdown diodes have a first breakdown voltage and the second and fourth diodes have a second breakdown voltage higher than the first breakdown voltage. Fifth and sixth breakdown diodes having the first breakdown voltage are connected to the second and fourth conductors, respectively, after the potential barrier regions are formed.

9 Claims, 2 Drawing Sheets

CCD HAVING CHARGE-INJECTED POTENTIAL BARRIER REGIONS PROTECTED FROM OVERVOLTAGES

BACKGROUND OF THE INVENTION

1. Field of the Invention

The present invention relates to a charge-coupled device (CCD) in which potential barrier regions are formed by a charge injection method.

2. Description of the Related Art

In a two-phase clocked CCD, a single-layered structure of polysilicon electrodes is formed on an n-type charge transfer layer and embedded in an insulating layer. These electrodes are divided into recurrent groups of two electrodes each, the electrodes of each group being connected respectively to receive first and second clock pulse sequences of a 180-degree phase difference. In the n-type charge transfer layer, a series of $n^-$-type regions is formed as potential barriers so that each barrier region corresponds to each polysilicon electrode and occupies one half of the area below the corresponding electrode. However, misalignment possibly occur between the electrodes and the $n^-$-type regions due to manufacturing tolerances. Such misalignment results in the generation of potential variations at the edges of the electrodes, which constitute a hindrance to the transfer movement of charge packets through the charge transfer layer.

In order to overcome the misalignment problem, Japanese Patent Application Hei-8-188905 discloses a two-phase clocked CCD in which electrodes are divided into recurrent groups of four electrodes each. Potential barrier regions are formed by momentarily applying a DC potential to alternate ones of the electrodes of each group so that electrons are injected into an insulating layer below such electrodes and self-aligned therewith. With the potential barrier regions being formed, first two electrodes of each group are connected together to operate as a first transfer gate and second two electrodes of the group are connected together to operate as a second transfer gate. During operation, the first and second transfer gates of each electrode group are supplied with the first and second clock pulse sequences, respectively.

However, a need exists to protect the CCD during the charge injection mode as well as during the operational mode from undesirable high input voltages.

SUMMARY OF THE INVENTION

It is therefore an object of the present invention to provide a CCD in which self-aligned potential barrier regions and transfer layer are protected from possible high input voltages and a method for providing such protection.

According to a first aspect of the present invention, there is provided a charge-coupled device comprising a semiconductor substrate, a charge transfer layer on the substrate, an insulating layer on the charge transfer layer, and a sequence of electrodes divided into recurrent groups of first, second, third and fourth electrodes each, the sequence of electrodes being arranged in a single-layered structure on the insulating layer. First, second, third and fourth conductors are connected respectively to the first, second, third and fourth electrodes of each electrode group. The insulating layer permanently holds electrons in positions respectively corresponding to the second and fourth electrodes of each group. First, second, third and fourth breakdown diodes are connected respectively to the first, second, third and fourth conductors, where the first and third breakdown diodes have a first breakdown voltage and the second and fourth diodes have a second breakdown voltage higher than the first breakdown voltage.

Preferably, connecting means are provided for connecting fifth and sixth breakdown diodes having the first breakdown voltage to the second and fourth conductors, respectively, after the potential barrier regions are formed.

According to a second aspect, the present invention provides a method for a charge-coupled device which comprises a semiconductor substrate, a charge transfer layer on the substrate, an insulating layer on the charge transfer layer, and a sequence of electrodes divided into recurrent groups of first, second, third and fourth electrodes each, the sequence of electrodes being arranged in a single-layered structure on the insulating layer. First, second, third and fourth conductors are connected respectively to the first, second, third and fourth electrodes of each electrode group. The method comprises the steps of connecting first, second, third and fourth breakdown diodes respectively to the first, second, third and fourth conductors, momentarily applying a voltage to the second and fourth conductors for injecting electrons into the insulating layer so that the electrons are permanently held in positions respectively corresponding to the second and fourth electrodes of each group, and connecting the first, second, third and fourth conductors to external circuitry, where the first and third breakdown diodes have a first breakdown voltage and the second and fourth diodes have a second breakdown voltage higher than the first breakdown voltage.

Preferably, fifth and sixth breakdown diodes are connected to the second and fourth conductors, respectively, and subsequently the first, second, third, fourth conductors are connected to the external circuitry.

BRIEF DESCRIPTION OF THE DRAWINGS

The present invention will be described in further detail with reference to the accompanying drawings, in which.

DETAILED DESCRIPTION

Figure 1:
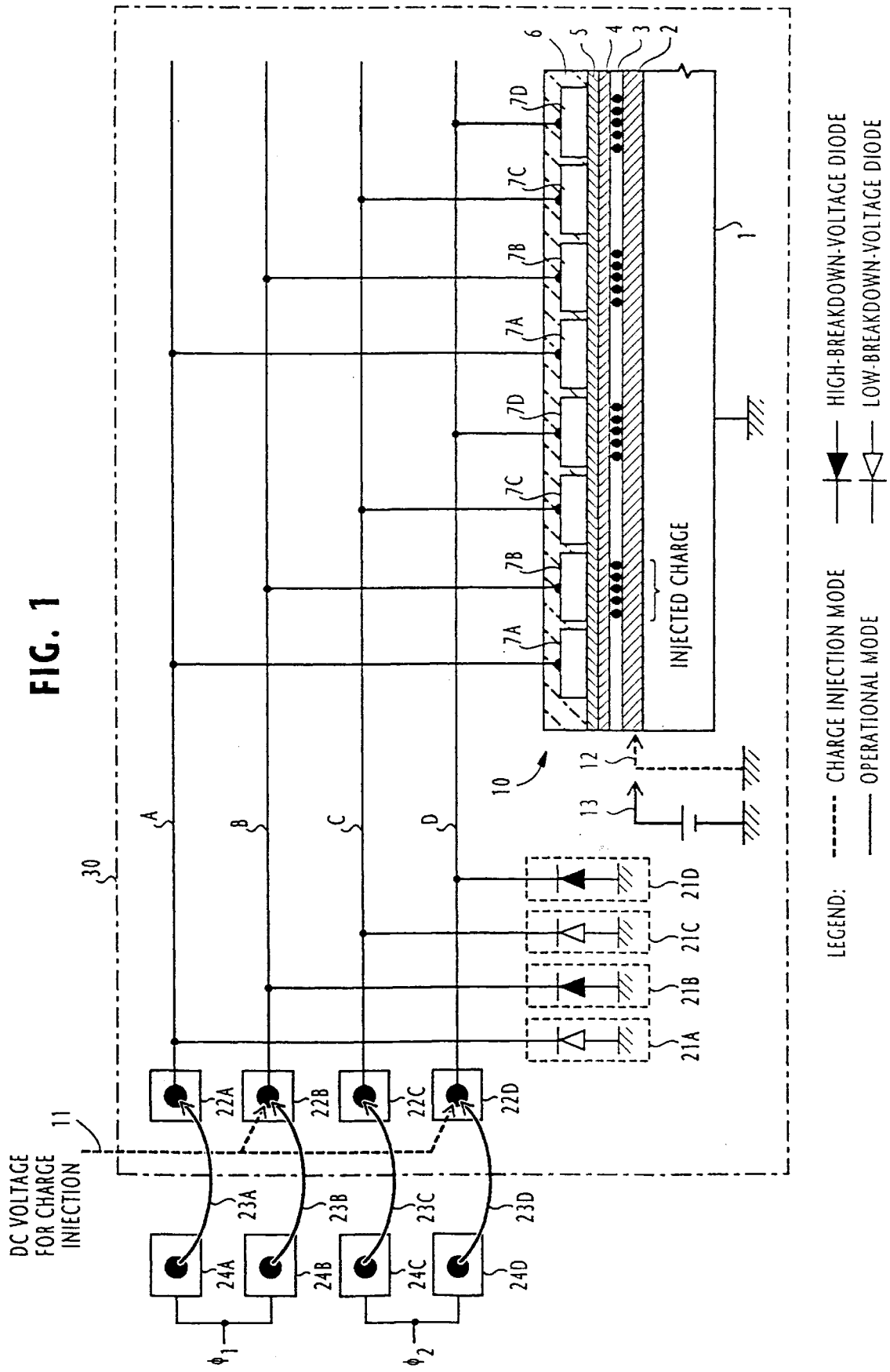
FIG. 1 is a circuit diagram of an overvoltage protection circuit arrangement for a charge-coupled device according to a first embodiment of the present invention.

In FIG. 1, there is shown a charge-coupled device (CCD) 10 which is protected from possible high input voltages by an overvoltage protection circuit arrangement according to a first embodiment of this invention.

CCD 10 comprises a p-type semiconductor substrate 1 on which an n-type charge transfer layer 2 and a silicon-dioxide layer 3 are successively deposited. On the silicon dioxide layer 3 are formed successive layers 4 and 5 of silicon nitride and silicon dioxide, respectively. Within an insulating film 6 is embedded a recurrent series of polysilicon electrodes 7A, 7B, 7C and 7D arranged on the silicon dioxide layer 5 in a single-layered structure.

Polysilicon electrodes 7A, 7B, 7C and 7D are connected respectively to bonding pads 22A, 22B, 22C and 22D via lines A, B, C and D and further to ground potential via breakdown (or clamping) diodes 21A, 21B, 21C and 21D which act as input protection elements. Breakdown diodes 21A and 21C have a lower breakdown voltage (or clamping level), typically, 20 volts, while breakdown diodes 21B and 21D have a higher breakdown voltage of typically 40 volts. These breakdown diodes 21 and the bonding pads 22 are fabricated on a same semiconductor chip 30 with the CCD 10.

The semiconductor chip 30 is then subjected to a charge injection mode of operation. In this mode, a positive DC voltage of 30 volts is momentarily applied through lead 11 to bonding pads 22B and 22D to which the higher breakdown voltage diodes 21B and 21D are connected, and the n-type layer 2 is connected to a 0 volt level, or ground potential as shown at 12, with the substrate 1 being grounded. As a result, electrons in the n-type layer 2 are caused to move towards the biased electrodes 7B and 7D, tunneling through the silicon dioxide layer 3, and are captured by the trapping energy level present at the interface between layers 3 and 4. These injected electrons remain after the positive DC voltage is removed and are permanently trapped in positions below the electrodes 7B and 7D. These injected electrons act as potential barrier regions self-aligned precisely with electrodes 7B and 7D.

Since the breakdown voltage of diodes 21B and 21D is appropriately higher than the voltage used for charge injection, the potential barrier regions can be formed under the protection of these diodes from input voltages which may possibly be higher than the breakdown voltage of 40 volts.

With the potential barrier regions being formed in the CCD 10, bonding wires 23A to 23D are used to connect terminals 24A to 24D provided on a package, not shown, to bonding pads 22A to 22D, and then the semiconductor chip 30 is housed in the package.

During an operational mode, the n-type layer 2 is positively biased with respect to the substrate 1 as shown at 13 and terminals 24A and 24B are connected together to receive a clock pulse sequence $\phi_1$ and terminals 24C and 24D are connected together to receive a clock pulse sequence $\phi_2$ which is 180 degrees phase shifted with respect to the pulse sequence $\phi_1$. As a result, electrodes 7A and 7B are biased together at the same potential to operate as a first transfer gate with phase $\phi_1$ and electrodes 7C and 7D are biased together at the same potential to operate as a second transfer gate with phase $\phi_2$.

In this way, information-bearing charge packets, which will be produced by adjacent photodiodes (not shown) and dumped into the n-type layer 2, are caused to successively move through it in response to 180-degree phase shifts. The self-aligned potential barrier regions serve to prevent undesirable potential variations which could otherwise occur at the edges of the electrodes if they were misaligned with the associated electrodes. Thus, the charge packets in the transfer layer 2 can be transferred therethrough without hindrance.

The breakdown voltage of diodes 21A and 21C is set at a value appropriately higher than the clock voltages applied to electrodes 7A and 7C. The charge transfer operation of the CCD 10 thus proceeds under the protection of these diodes from input voltages which may possibly be higher than their breakdown voltage of 20 volts.

Figure 2:
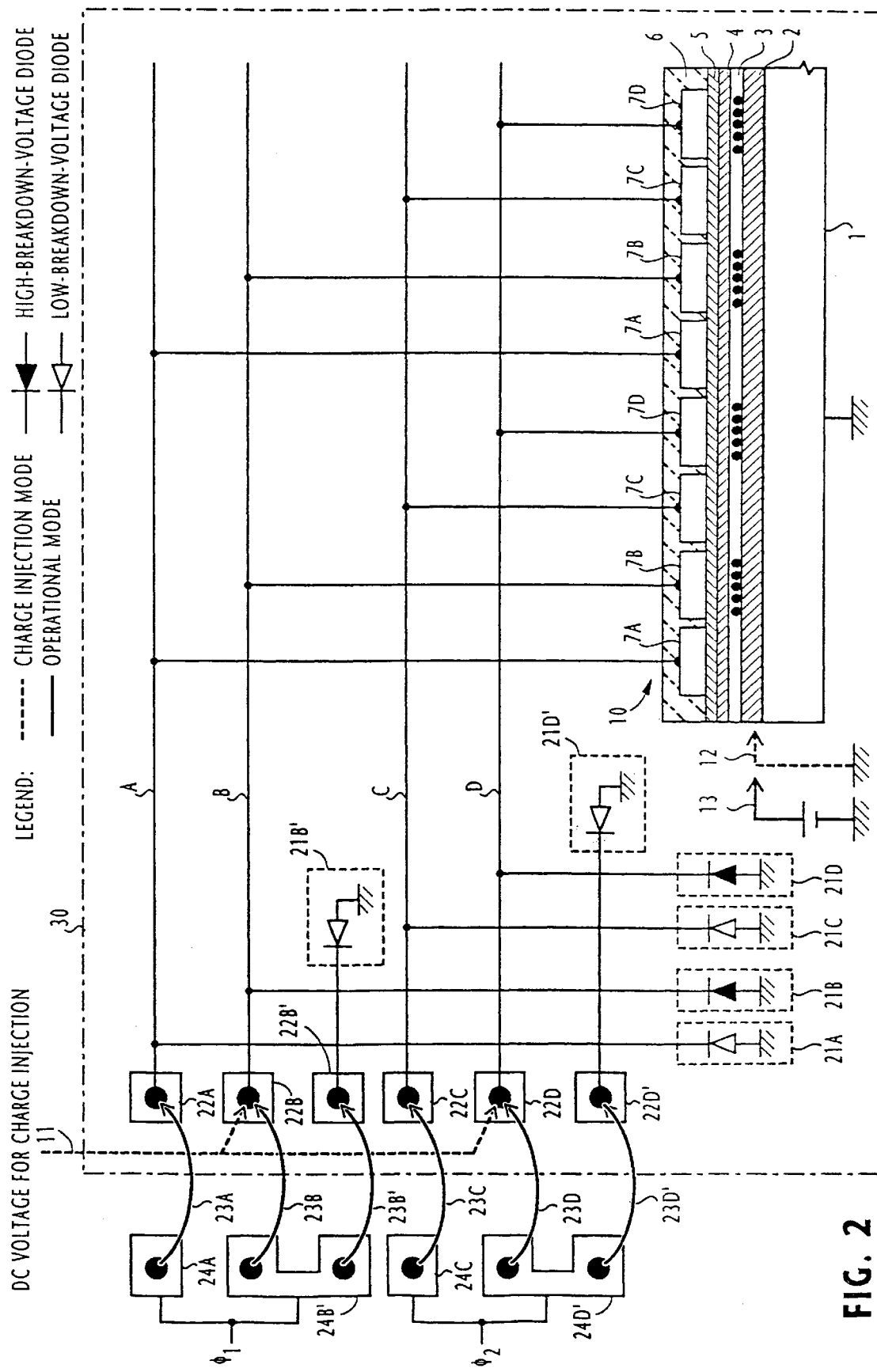
FIG. 2 is a circuit diagram of an overvoltage protection circuit arrangement for a charge-coupled device according to a second embodiment of the present invention.

FIG. 2 shows a second embodiment of this invention. In this embodiment, bonding pads 22B' and 22D' are additionally provided on the semiconductor chip 30 and breakdown diodes 21B' and 21D' are additionally connected to these bonding pads. These additional breakdown diodes have the same breakdown voltage of 20 volts as the breakdown diodes 21A and 21C. On the package side, two-point terminals 24B' and 24D' are provided, instead of the single-point terminals 24B and 24D. The charge injection process proceeds in the same manner as in the previous embodiment, using the bonding pads 22B and 22D. During the operational mode, bonding wires 23B' and 23D' are additionally used to connect the terminals 24B' and 24D' to the bonding pads 22B' and 22D'.

With the provision of the additional low-breakdown voltage diodes, electrodes 7B and 7D are under the same overvoltage protection as electrodes 7A and 7C are protected by diodes 21A and 21C. Further, the potential barrier regions are protected by the additional breakdown diodes from undesirable voltages which are lower than the voltage used to inject the charges but higher than the driving clock pulse.

What is claimed is:

1. A charge-coupled device comprising:

a semiconductor substrate;

a charge transfer layer on said substrate;

an insulating layer on said charge transfer layer;

a sequence of electrodes divided into recurrent groups of first, second, third and fourth electrodes each, said sequence of electrodes being arranged in a single-layered structure on said insulating layer;

first, second, third and fourth conductors connected respectively to said first, second, third and fourth electrodes of said each group;

said insulating layer permanently holding electrons in positions respectively corresponding to said second and fourth electrodes of said each group; and first, second, third and fourth breakdown diodes connected respectively to said first, second, third and fourth conductors, said first and third breakdown diodes having a first breakdown voltage and said second and fourth diodes having a second breakdown voltage higher than the first breakdown voltage.

2. A charge-coupled device as claimed in claim 1, further comprising means for connecting said first and second conductors together to receive a first clock pulse sequence and connecting said third and fourth conductors together to receive a second clock pulse sequence phase-shifted by 180 degrees with respect to said first clock pulse sequence.

3. A charge-coupled device as claimed in claim 1, further comprising:

fifth and sixth breakdown diodes having said first breakdown voltage; and means for connecting the fifth and sixth breakdown diodes to said second and fourth conductors, respectively, and connecting said first, second, third and fourth conductors to external circuitry.

4. A charge-coupled device as claimed in claim 2, wherein said connecting means comprises:

first, second, third, fourth bonding pads connected respectively to said first, second, third and fourth conductors and fifth and six bonding pads connected to said fifth and six breakdown diodes; and first, second, third, fourth, fifth and sixth bonding wires for connecting said first, second, third, fourth, fifth and sixth bonding pads to the external circuitry.

5. A charge-coupled device as claimed in claim 3, wherein said first, second and fifth bonding wires are connected together to receive a first clock pulse sequence and said third, fourth and sixth bonding wires are connected together to receive a second clock pulse sequence phase-shifted by 180 degrees with respect to said first clock pulse sequence.

6. In a charge-coupled device comprising:

a semiconductor substrate;

a charge transfer layer on said substrate;

an insulating layer on said charge transfer layer;

a sequence of electrodes divided into recurrent groups of first, second, third and fourth electrodes each, said sequence of electrodes being arranged in a single-layered structure on said insulating layer; and first, second, third and fourth conductors connected respectively to said first, second, third and fourth electrodes of said each group;

a method comprising the steps of:

a) connecting first, second, third and fourth breakdown diodes respectively to said first, second, third and fourth conductors, said first and third breakdown diodes having a first breakdown voltage and said second and fourth diodes having a second breakdown voltage higher than the first breakdown voltage;

b) momentarily applying a voltage to said second and fourth conductors for injecting electrons into said insulating layer so that said electrons are permanently held in positions respectively corresponding to said second and fourth electrodes of said each group; and c) connecting said first, second, third and fourth conductors to external circuitry.

7. The method of claim 6, wherein the step (c) comprises connecting said first and second conductors together to receive a first clock pulse sequence and connecting said third and fourth conductors together to receive a second clock pulse sequence phase-shifted by 180 degrees with respect to said first clock pulse sequence.

8. The method of claim 6, wherein the step (c) comprises connecting fifth and sixth breakdown diodes to said second and fourth conductors, respectively, and subsequently connecting said first, second, third, fourth conductors to external circuitry.

9. The method of claim 6, wherein the step (c) comprises connecting fifth and sixth breakdown diodes to said second and fourth conductors, respectively, and subsequently connecting said first and second conductors together to receive a first clock pulse sequence and connecting said third and fourth conductors together to receive a second clock pulse sequence phase-shifted by 180 degrees with respect to said first clock pulse sequence.

\* \* \* \* \*